(12) United States Patent
Narasaraju et al.

(10) Patent No.: US 10,451,672 B2
(45) Date of Patent: Oct. 22, 2019

(54) PROBING APPARATUS FOR TAPPING ELECTRIC SIGNALS GENERATED BY A DEVICE-UNDER-TEST

(71) Applicant: TELEFONAKTIEBOLAGET LM ERICSSON (PUBL), Stockholm (SE)

(72) Inventors: Vignesh Narasaraju, Kista (SE); Karl-gösta Helgesson, Järfälla (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 72 days.

(21) Appl. No.: 15/568,740

(22) PCT Filed: Apr. 24, 2015

(86) PCT No.: PCT/SE2015/050463
§ 371 (c)(1),
(2) Date: Oct. 23, 2017

(87) PCT Pub. No.: WO2016/171596
PCT Pub. Date: Oct. 27, 2016

(65) Prior Publication Data
US 2018/0120376 A1  May 3, 2018

(51) Int. Cl.
*G01R 31/00* (2006.01)
*G01R 31/28* (2006.01)
(Continued)

(52) U.S. Cl.
CPC ..... *G01R 31/2887* (2013.01); *G01R 1/06722* (2013.01); *G01R 31/2891* (2013.01);
(Continued)

(58) Field of Classification Search
CPC ............ G01R 31/2887; G01R 31/2891; G01R 31/2822; G01R 31/2648; G01R 31/2893;
(Continued)

(56) References Cited

U.S. PATENT DOCUMENTS 5,351,876 A * 10/1994 Belcher ............. H01L 21/67121
228/180.22
5,828,224 A * 10/1998 Maruyama ........... G01R 1/0483
324/756.02
(Continued)

FOREIGN PATENT DOCUMENTS

| EP | 0439948 A1 | 8/1991 |
| EP | 2317330 A1 | 5/2011 |
| WO | 2014016018 A1 | 1/2014 |

OTHER PUBLICATIONS

The International Search Report and Written Opinion issued by the European Patent Office dated Feb. 15, 2016 for PCT Application No. PCT/IB2015/050463.

*Primary Examiner* — Minh N Tang

(57) ABSTRACT

A probing apparatus for detection of an electric signal generated by a device-under-test. The probing apparatus includes a rigid support structure having a contact surface for sliding contact with the device-under-test, and a probing instrument to contact the connector for tapping the electric signal. Magnets on the support structure apply attracting force on a mating metal element on the device-under-test such that the probing instrument is aligned to contact the connector, wherein a gap is formed between each magnet and mating metal element when the contact surface touches the device-under-test.

8 Claims, 9 Drawing Sheets

(51) Int. Cl.
*G01R 1/067* (2006.01)
*G01R 1/073* (2006.01)

(52) U.S. Cl.
CPC ...... *G01R 1/07314* (2013.01); *G01R 1/07328* (2013.01); *G01R 31/2822* (2013.01)

(58) Field of Classification Search
CPC ............ G01R 1/06722; G01R 1/07314; G01R 1/07328; G01R 1/0466
See application file for complete search history.

(56) References Cited

U.S. PATENT DOCUMENTS

| | | | |
|---|---|---|---|
| 7,183,763 B1 | 2/2007 | Murata | |
| 8,198,907 B2 * | 6/2012 | Chou | G01R 1/0425 324/750.1 |
| 2013/0113513 A1 * | 5/2013 | Seo | G01R 1/0483 324/756.02 |

* cited by examiner

PROBING APPARATUS FOR TAPPING ELECTRIC SIGNALS GENERATED BY A DEVICE-UNDER-TEST

This application is a 371 of International Application No. PCT/SE2015/050463, filed Apr. 24, 2015, the disclosure of which is fully incorporated herein by reference.

TECHNICAL FIELD

The present disclosure relates generally to a probing apparatus for detecting an electric signal generated by a device-under-test by tapping the electric signal from a connector on the device-under-test.

BACKGROUND

In the field of telecommunication, it is sometimes desirable to test the operation of a radio device, e.g. in terms of performance, capability and accuracy. When performing such a test, a probing instrument, often referred to as a "probe", is applied on a connector in the radio device for tapping an electric signal that is generated by some electronic circuitry in the radio device. The tapped signal is then conveyed to a measuring equipment or the like for detection and analysis of the tapped electric signal, e.g. performed in order to test and/or evaluate the operation of the radio device. In particular, it is often of interest to measure and analyze electrical signals that conveys information to be further processed, e.g. Radio Frequency, RF signals, generated by a radio device for transmission over a radio interface. The above tapping procedure may be employed also in other technical fields where electronic circuitry is used and even though this disclosure sometimes refers to a radio device as an example, it is not limited thereto.

A radio device or any other signal-generating equipment that is tested by tapping an electrical signal therefrom, is commonly called a "device-under-test" which term will be used in this disclosure. The term "probing apparatus" will also be used to represent a fixture or the like that holds a probing instrument. The probing apparatus is applied to the device-under-test to bring the probing instrument on the probing apparatus into physical contact with a connector on the device-under-test from which connector the electric signal can be tapped. The probing apparatus is thus basically a test tool used to support and hold the device-under-test while tapping the electrical signal therefrom.

However, there are some problems associated with current conventional techniques for tapping electric signals in the manner described above. For example, one commonly used technique for applying a probing apparatus to a device-under-test employs a "snap-on" mechanism which means that some mechanical snap fastening means is used to hold the probing apparatus firmly to the device-under-test. In this case, when the probing apparatus is applied it typically hits the device-under-test with considerable force or impact such that there is a risk that the connector on the device-under-test and/or the probing instrument on the probing apparatus is/are damaged by the resulting impact since they are typically fragile parts that are sensitive to break easily.

Another problem is that it may be necessary to align the probing instrument to the connector if they do not meet and contact properly when the probing apparatus is applied such that tapping is not possible. This misalignment may be caused by dimensional tolerances on the device-under-test. Once applied, it is often difficult, or even impossible, to make such alignment of the probing instrument whenever needed since the snap fastening means or other mechanical fastening holds the probing apparatus firmly to the device-under-test. If the parts are aligned with "brute force" when held together this way, there is again a risk that the connector and the probing instrument might become damaged. The above problems are thus difficult to deal with, particularly if the probing apparatus needs to be applied and released several times.

SUMMARY

It is an object of embodiments described herein to address at least some of the problems and issues outlined above. It is possible to achieve this object and others by using a probing apparatus as defined in the attached independent claim.

The probing apparatus is arranged for detection of an electric signal generated by a device-under-test by tapping the electric signal from a connector on the device-under-test when the probing apparatus is applied on the device-under-test. The probing apparatus comprises a rigid support structure having a contact surface adapted for sliding contact with the device-under-test, and a probing instrument fixed to the support structure. The probing instrument is adapted to contact the connector for tapping the electric signal. The probing apparatus may comprise more than one such probing instrument, each being adapted to contact a corresponding connector for tapping electric signals.

The probing apparatus also comprises at least two magnets which are fixed to the support structure. Each magnet is adapted to apply attracting force on a mating metal element on the device-under-test such that the probing instrument is aligned to contact the connector, wherein a gap is formed between each magnet and mating metal element when said contact surface touches the device-under-test. Hence, the magnets will not come into physical contact with the mating metal elements when the probing apparatus is applied on the device-under-test. Thereby, the probing apparatus can be applied and carefully aligned to the device-under-test without friction between magnets and metal elements and also avoiding damaging impact, while the attracting force of the magnets will hold the probing apparatus and the device-under-test together in the aligned position.

The above probing apparatus may be configured and implemented according to different optional embodiments to accomplish further features and benefits, to be described below.

BRIEF DESCRIPTION OF DRAWINGS

The solution will now be described in more detail by means of exemplary embodiments and with reference to the accompanying drawings, in which.

DETAILED DESCRIPTION

Briefly described, a probing apparatus is provided that allows for easy alignment of the probing apparatus when applied to a device-under-test, by having a contact surface adapted for sliding contact with the device-under-test and magnets which will apply attracting force on mating metal elements on the device-under-test such that the probing instrument is aligned to contact the connector. When the probing apparatus is applied and the contact surface is in sliding contact with the device-under-test, a gap is formed between each magnet and mating metal element. Thereby, the probing apparatus can be applied and carefully aligned to the device-under-test without causing any damaging impact while the magnet force will hold together the probing apparatus and the device-under-test in the aligned position when tapping an electric signal from a connector on the device-under-test.

Since there is a gap between the magnets and the mating metal elements on the device-under-test, no friction occurs between them when any necessary alignment is made by sliding contact between the contact surface and a corresponding surface on the device-under-test. Some simplified but illustrative examples of how this can be accomplished will be described below with reference to some schematic figures.

Figure 1:
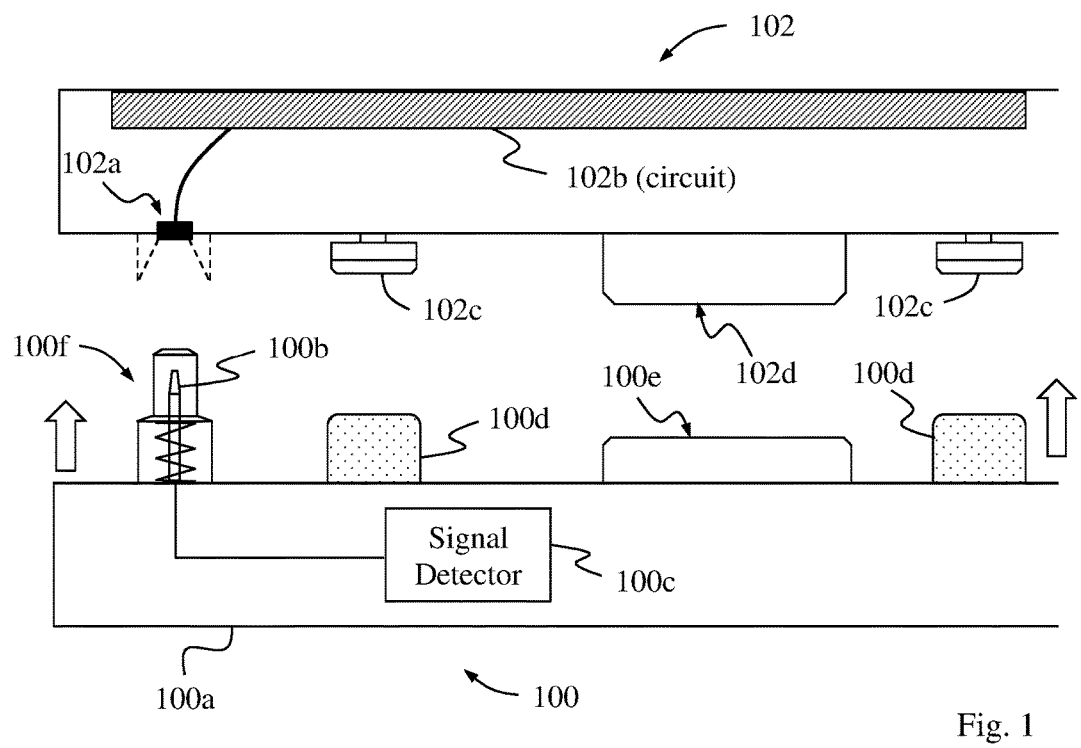
FIG. 1 is a simplified illustration of a probing apparatus and a device-under-test, according to some possible embodiments.
Figure 2:
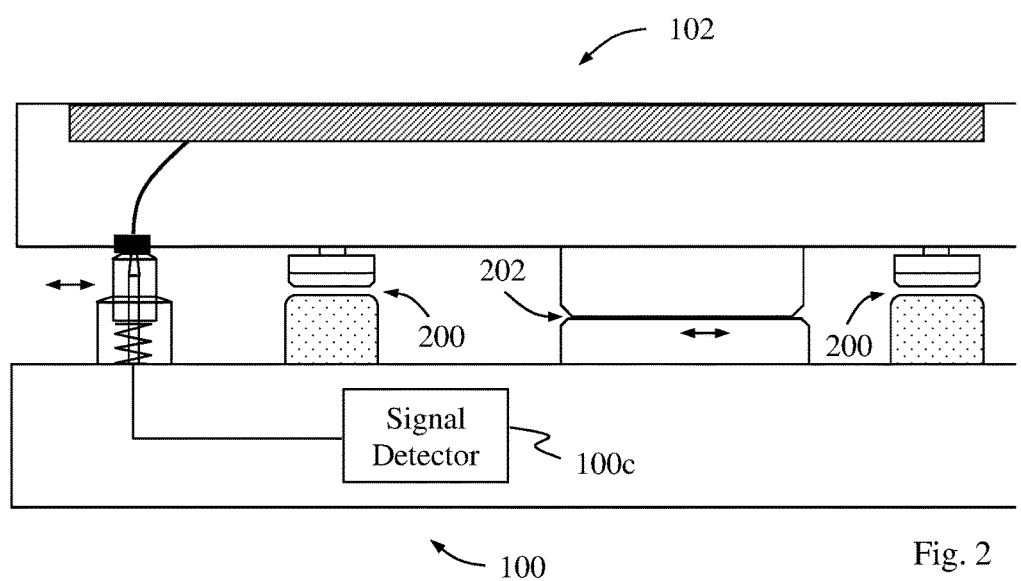
FIG. 2 is an illustration of when the probing apparatus and device-under-test of FIG. 1 are put together for tapping an electric signal, according to further possible embodiments.

FIG. 1 illustrates a probing apparatus 100 which is arranged for detection of an electric signal generated by a device-under-test 102 by tapping the electric signal from a connector 102a on the device-under-test 102 when the probing apparatus 100 is applied on the device-under-test 102 in the manner shown in FIG. 2. The device-under-test 102 may be configured for use in equipment for radio communication and may comprise a radio circuit 102b or similar that generates the electric signal which can be tapped on the connector 102a and detected or registered by a signal detector 100c or the like for measurement and/or further analysis. The electric signal may for example be an RF signal for radio transmission which RF signal is to be measured and/or analyzed for whatever reason, although the solution is not limited to RF signals. The embodiments herein can thus be used for tapping any electrical signal that holds some form of information in general. The detection and handling of the tapped electric signal is however somewhat outside the scope of this solution which is rather directed to the actual tapping of the electric signal.

The probing apparatus 100 comprises a rigid support structure 100a which has a contact surface 100e adapted for sliding contact with the device-under-test 102 once the probing apparatus 100 is applied on the device-under-test 102. The probing apparatus 100 also comprises a probing instrument 100b that is fixed to the support structure 100a and adapted to contact the connector 102a for tapping the electric signal. The figure illustrates that the probing instrument 100b is connected to the signal detector 100c so that the tapped signal will be conveyed to and received by the signal detector 100c. Although only one probing instrument 100b is shown in this example, the solution may be useful for more than one probing instrument 100b on the probing apparatus 100 that can be used for tapping electric signals from corresponding connectors 102a on the device-under-test 102.

The probing apparatus 100 can be applied on the device-under-test 102 by approaching the probing apparatus 100 towards the device-under-test 102, as schematically indicated by two white arrows in FIG. 1, until the probing instrument 100b contacts the connector 102a and the contact surface 100e also comes into contact with the device-under-test 102, e.g. by touching a corresponding contact surface 102d on the device 102. The position of the probing instrument 100b and/or the contact surface 100e may be adjustable on the support structure 100a to make sure they both will come into contact properly with the device-under-test 102 when the probing apparatus 100 is applied.

The probing apparatus 100 further comprises at least two magnets 100d which are fixed to the support structure 100a and facing the device-under-test 102 when the probing apparatus 100 is applied. For example, the magnets 100d may be axially magnetized permanent magnets e.g. of a cylinder-like form. In this example only two magnets are illustrated although any number of magnets could be used depending on implementation. Each magnet 100d is adapted to apply attracting force on a mating metal element 102c on the device-under-test 102 such that the probing instrument 100b is more or less aligned to contact the connector 102a. As shown in FIG. 2, the magnets 100d are configured such that a gap 200 is formed between each magnet 100d and mating metal element 102c when the contact surface 100e touches the device-under-test 102, e.g. on the corresponding contact surface 102d.

The contact surface 100e on the probing apparatus 100 thus allows for a slight lateral movement by sliding against the contact surface 102d on the device-under-test 102 so as to align the probing instrument 100b to the connector 102a, as schematically indicated by a two-way arrow in FIG. 2. It is an advantage, among others, that the magnets 100d never come into contact with the mating metal elements 102c, hence the gap 200 thus avoiding friction between them, while the contact surface 100e touches the contact surface 102d on the device-under-test 102 as shown by numeral 202.

Several optional embodiments are possible to employ in the above-described probing apparatus 100. In one possible embodiment, the probing apparatus 100 may further comprise at least one spring device 100f adapted to be compressed against a spring force when the probing apparatus 100 is applied on the device-under-test 102, so as to apply a repelling force which balances the attracting force applied by the at least two magnets 100d. Thereby, the probing apparatus 100 and the device-under-test 102 will be held together with controlled force. In FIG. 1 the spring device 100f is uncompressed before the probing apparatus 100 is applied to the device-under-test 102, and in FIG. 2 the spring device 100f is compressed when the probing apparatus 100 has been applied to the device-under-test 102. In this example, the spring device 100f is configured as a spring surrounding the probing instrument 100b, although the spring device could also be positioned elsewhere relative the probing instrument 100b and the embodiment is not limited in this respect.

Figure 3A:
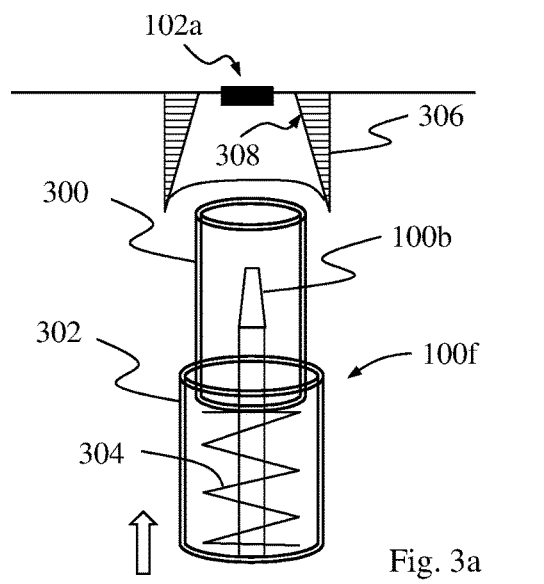
FIG. 3a is a detailed view of a spring device used in FIGS. 1 and 2, according to further possible embodiments.
Figure 3B:
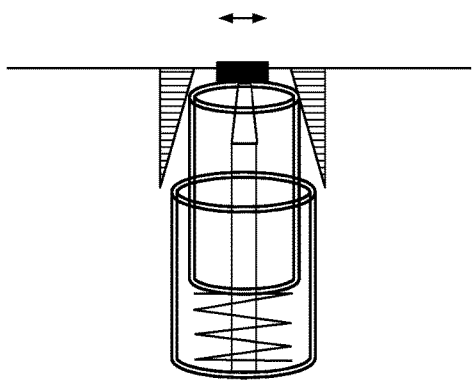
FIG. 3b is a detailed view of the spring device of FIG. 3a when the probing apparatus and device-under-test are put together, according to further possible embodiments.

An example of how the spring device 100f may be configured in more detail is shown in FIGS. 3a and 3b where FIG. 3a illustrates the spring device 100f in the uncompressed state, i.e. when the probing apparatus 100 is not applied to the device-under-test 102, and FIG. 3b illustrates the spring device 100f in the compressed state, i.e. when the probing apparatus 100 is applied to the device-under-test 102. In another possible embodiment, as shown in FIGS. 3a and 3b, the at least one spring device 100f may comprise a telescopic cylinder 300, 302 surrounding the probing instrument 100b and being adapted to contact the device-under-test 102 and retract against the spring force, here caused by a helical spring element 304, when the probing apparatus 100 is applied on the device-under-test 102.

The telescopic cylinder in this embodiment thus comprises two concentric members 300 and 302 where one member 300 is arranged to move axially inside the other somewhat wider member 302 in a telescopic manner while compressing the helical spring element 304. In yet another possible embodiment, the telescopic cylinder 300, 302 may be adapted to align the probing instrument 100b to the connector 102a by entering a tapered cavity 308 on the device-under-test 102 when the probing apparatus 100 is applied on the device-under-test 102. The device-under-test 102 may thus have a guiding ring 306 or the like fixedly positioned around the connector 102a which ring 306 is configured with the above tapered cavity 308 on its inside, so as to guide the telescopic cylinder 300, 302 when approaching the device-under-test 102 and thereby align the probing instrument 100b to the connector 102a.

It is further possible to configure and design the contact surface 100e on the support structure 100a in different optional ways e.g. as follows. In one possible embodiment, the contact surface 100e on the support structure 100a may be adapted to allow a sliding movement when touching a corresponding contact surface on the device-under-test 102, such as the above-mentioned contact surface 102d schematically shown in FIGS. 1 and 2. The contact surface 100e may be provided with a coating of a material that is suitable for sliding contact of low friction.

Figure 4:
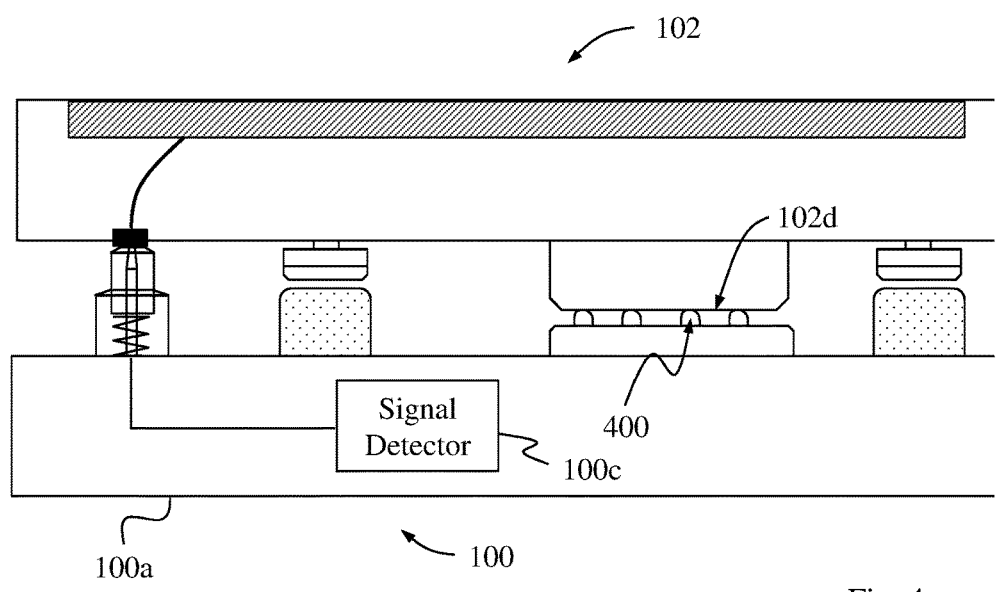
FIG. 4 is an illustration of an alternative example of how a contact surface may be designed on the probing apparatus, according to further possible embodiments.
Figure 5:
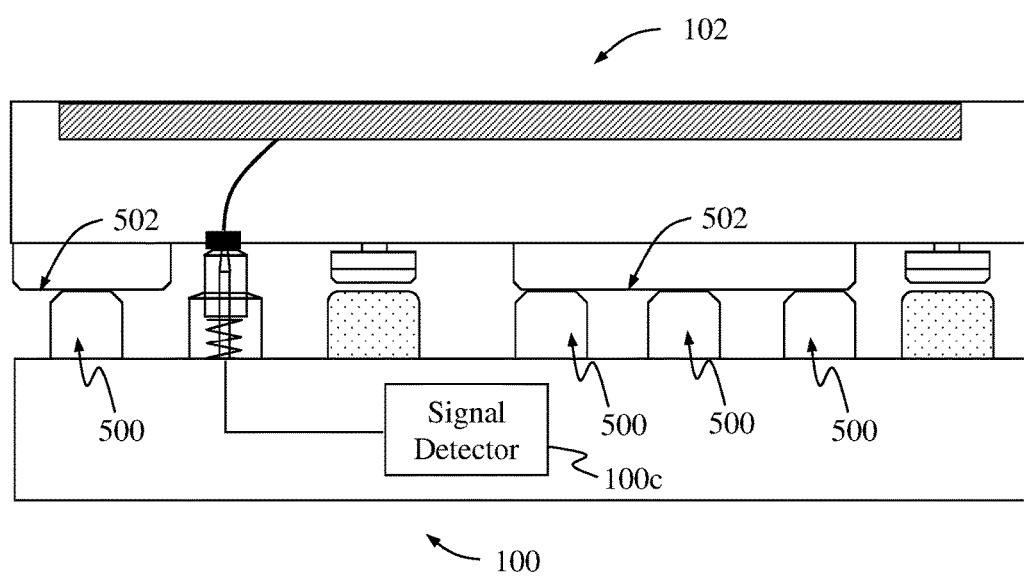
FIG. 5 is an illustration of another example of how a contact surface may be designed on the probing apparatus, according to further possible embodiments.
Figure 6:
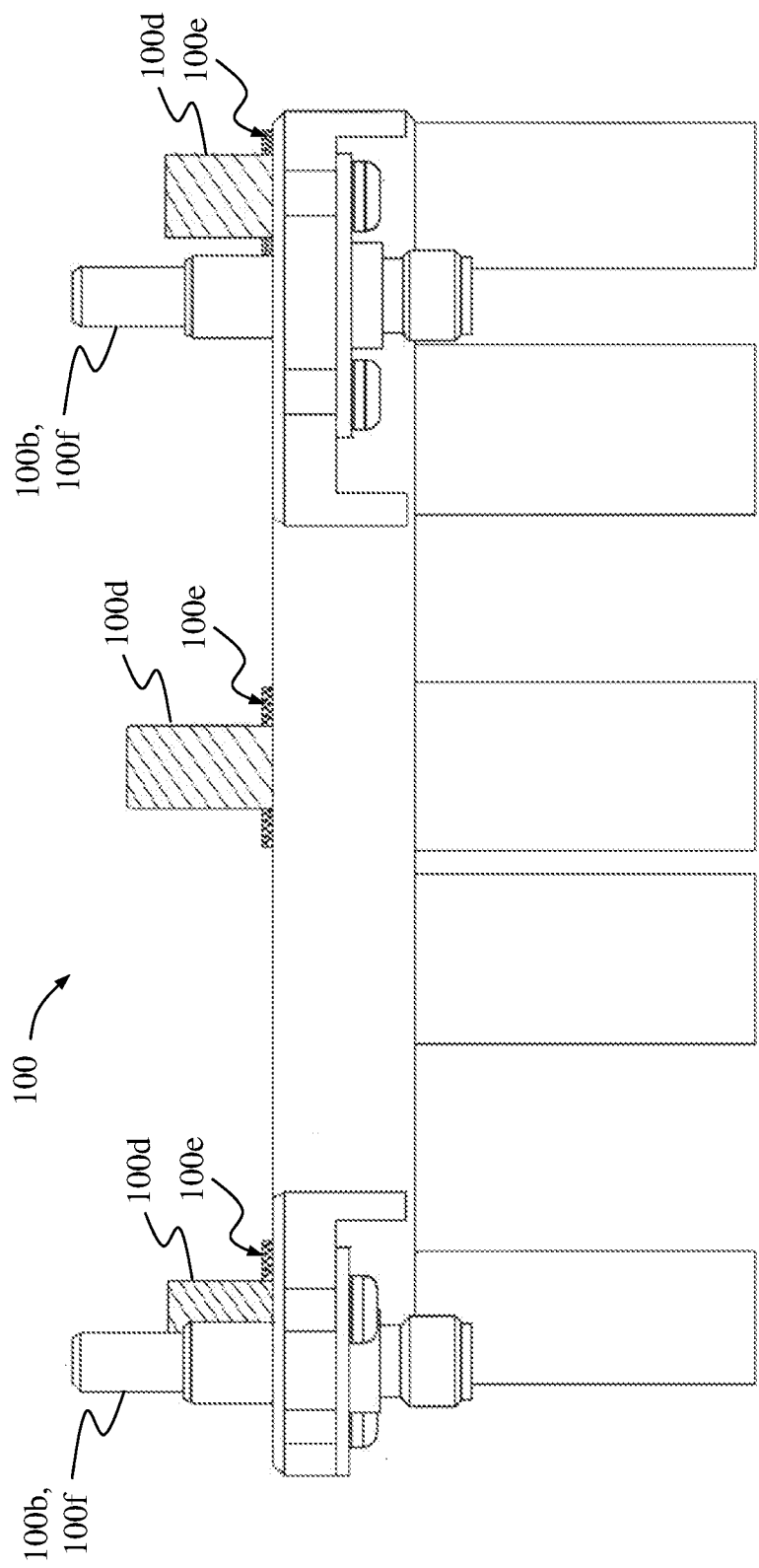
FIGS. 6-11 are some further example illustrations of how the probing apparatus may be configured and applied to a device-under-test in practice.

In another possible embodiment, e.g. as shown in FIG. 4, the contact surface 100e on the support structure 100a may comprise a plurality of protruding bulges or knobs 400 for contacting the contact surface 102d on the device-under-test 102. The term "knobs" is used here to represent any protruding, bulging or bloated parts of any shape or size. In still another possible embodiment, e.g. as shown in FIG. 5, the contact surface 100e on the support structure 100a may comprise one or more flat parts 500 being substantially parallel to the contact surface 502 on the device-under-test 102 when the probing apparatus 100 is applied on the device-under-test 102. The flat parts 500 may have any shape and/or size.

In FIGS. 1 and 2, the contact surface 100e on the support structure 100a is shown to comprise a single flat part which is parallel to the contact surface 102d on the device-under-test 102, which is another possible configuration of the contact surface. The two embodiments illustrated in FIGS. 4 and 5 may also be combined such that the contact surface 100e on the support structure 100a may comprise both protruding knobs 400 and one or more flat parts 500 in a suitable composite configuration.

The contact surface 100e on the support structure 100a may thus be configured and designed in any suitable manner depending on implementation, and possibly also depending on how the device-under-test 102 is configured and designed, so as to create a fitting sliding contact between the probing apparatus 100 and the device-under-test 102 which allows the above-described lateral adjustment illustrated by the two-way arrow in FIG. 2. For example, any number of knobs, flat parts and/or other forms of contact surfaces may be arranged on the support structure 100a within the scope of this solution, to accomplish the above-described sliding contact between the probing apparatus 100 and the device-under-test 102.

It was mentioned above that the probing apparatus 100 and the device-under-test 102 can be be held together with controlled force resulting from the repelling force of the spring device 100f and the attracting force of the magnets 100d. In another possible embodiment, each magnet's position relative the support structure 100a when in use may be adjustable for regulating the gap 200 so as to control the attracting force on the mating metal element 102c and thereby also the total resulting force holding the apparatus 100 onto the device-under-test 102. Alternatively or additionally, the mating metal elements 102c on the device-under-test 102 may be screw heads that may further be used for adjusting the gap 200 and the resulting attracting force of the magnets 100d. However, the solution is useful for any type or configuration of mating metal elements on the device-under-test as long as they can be subjected to the attracting force of the magnets 100d.

In another possible embodiment, the probing instrument 100b may be adapted to convey the tapped electric signal to a signal detector 100c for analysis of the electric signal, e.g. by means of a wire connecting the probing instrument 100b to the signal detector 100c, which has also been discussed above.

Advantages of the above-described probing apparatus and embodiments thereof include that the probing apparatus can be applied to a device-under-test without the risk of hitting the device-under-test severely such that damage may occur. The probing apparatus can also be carefully positioned relative the device-under-test by means of small lateral movements, so as to align the probing instrument to contact the connector for proper tapping of an electric signal therefrom. A further advantage is that the probing apparatus can be configured and dimensioned to fit a particular device-under-test and to provide a suitable or even optimal total attracting force that holds the parts together properly during tapping.

Some further examples of how the above-described probing apparatus 100 may be configured in practice and applied to a device-under-test 102 are shown in FIGS. 6-11, where the same numerals as in the previous examples are used to illustrate corresponding details. Thus in FIG. 6, a practical example of how the probing apparatus 100 as such may be realized is shown, in this case comprising two probing instruments and surrounding spring devices 100b, 100f and three magnets 100d. The probing apparatus 100 is also provided with contact surfaces 100e which are formed as pads around the magnets 100d.

Figure 7:
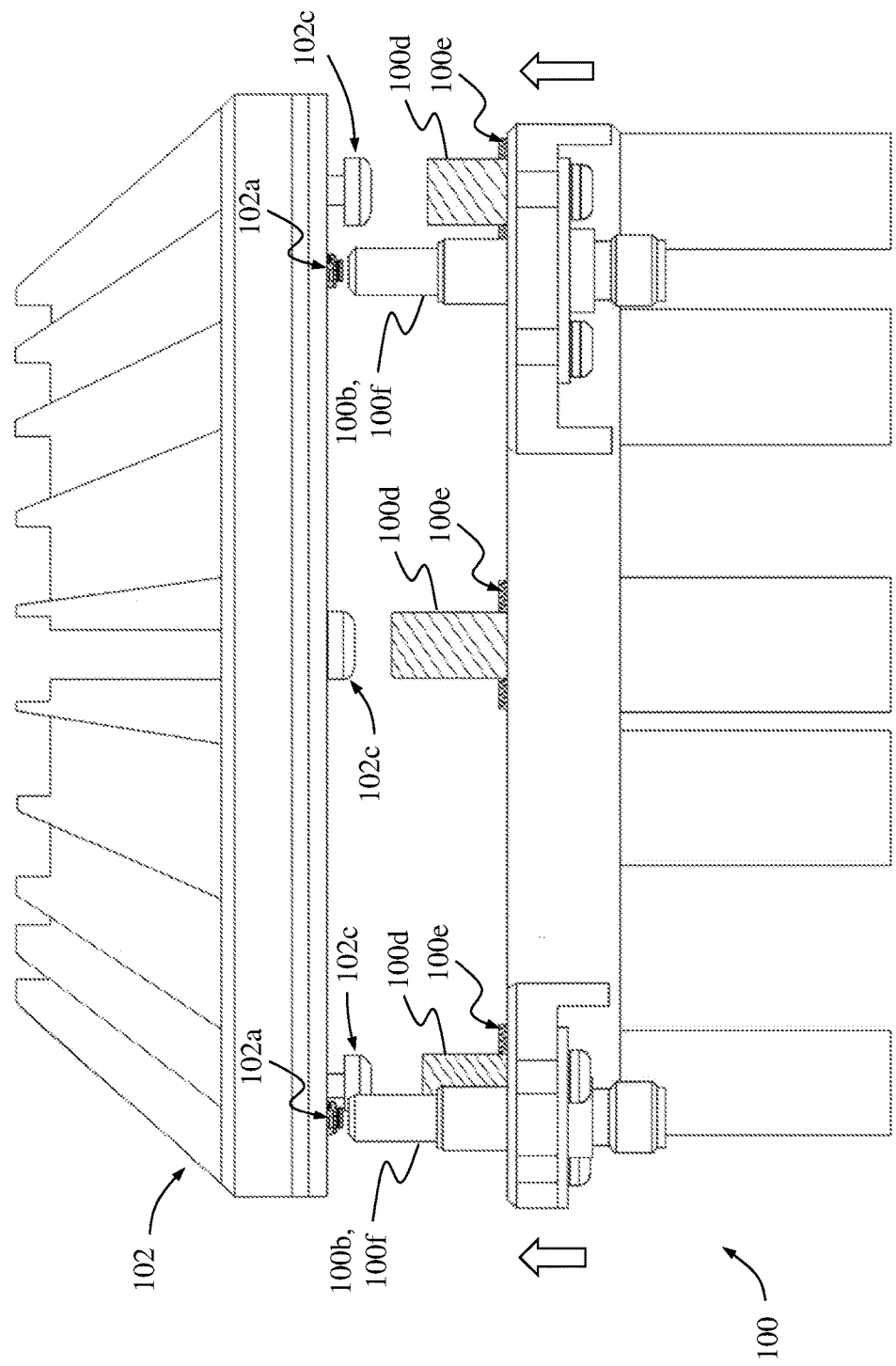
Figure 8:
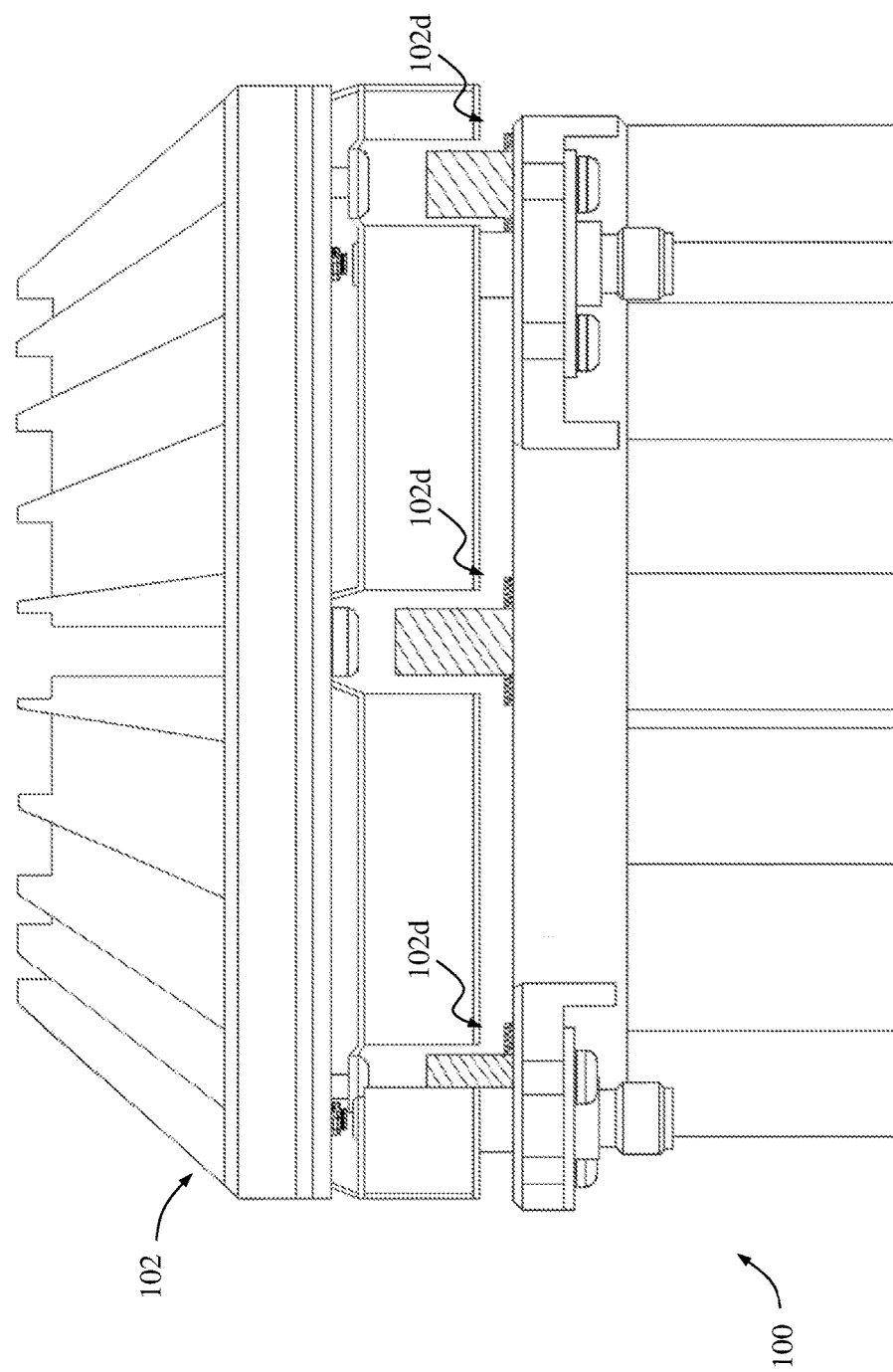

FIG. 7 illustrates that the probing apparatus 100 is moved towards the device-under-test 102, as indicated by white arrows, such that the probing instruments 100b, 100f are facing connectors 102a on the device-under-test 102 and the magnets 100d are facing mating metal elements 102c in the form of screws on the device-under-test 102. FIG. 8 illustrates that the device-under-test 102 has contact surfaces 102d which the pads 100e will touch when the probing apparatus 100 is applied to the device-under-test 102.

Figure 9:
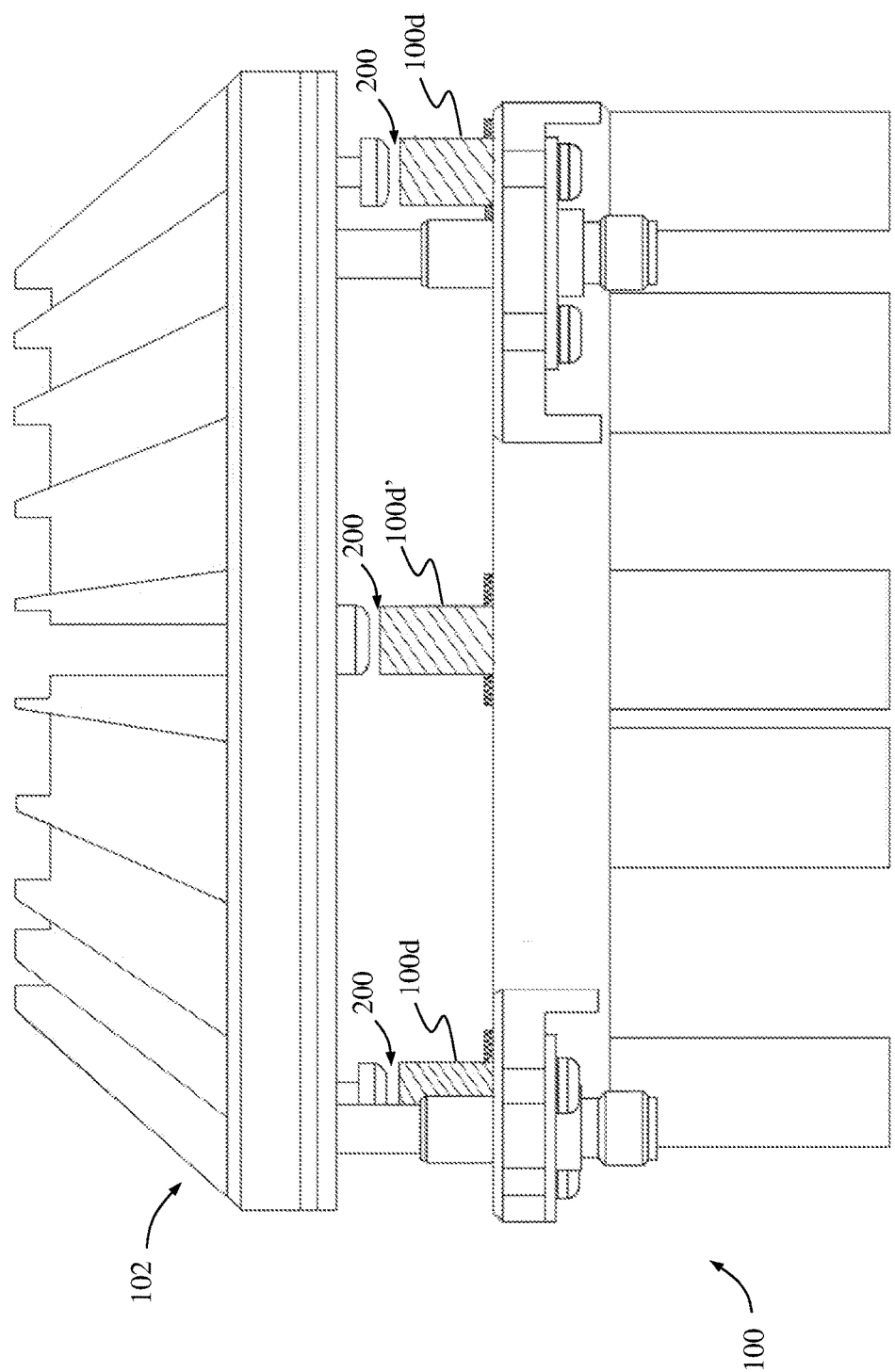
Figure 10:
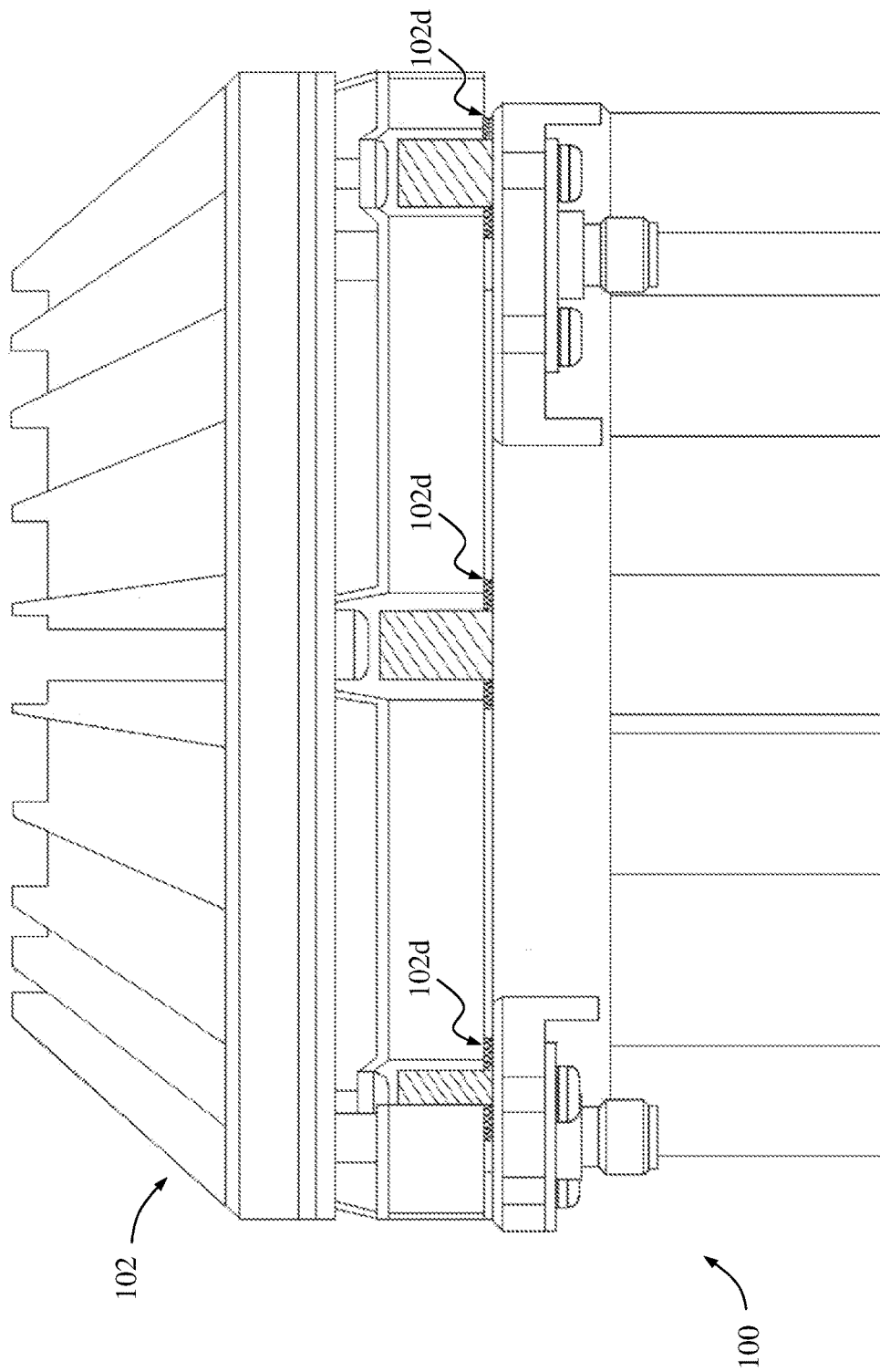
Figure 11:
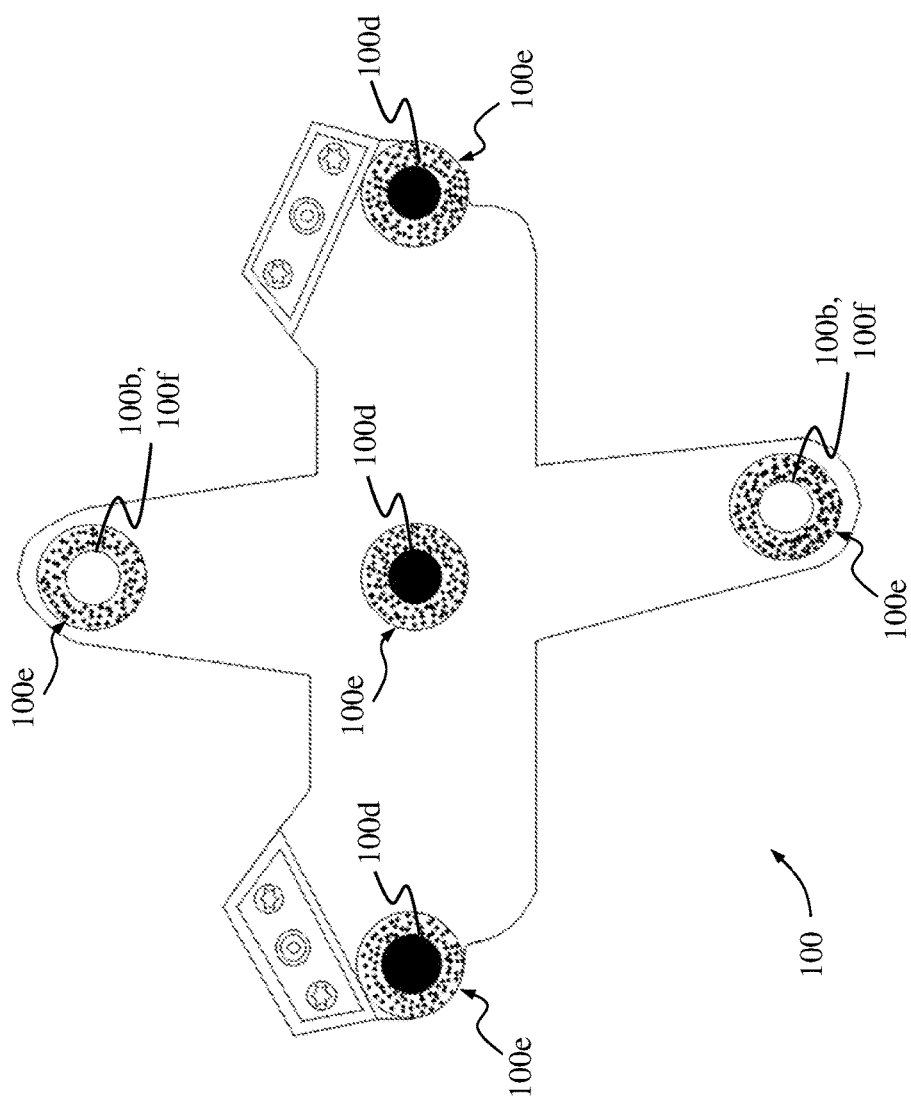

In FIG. 9, the probing apparatus 100 has been applied to the device-under-test 102 such that the probing instruments 100b, 100f come in contact with the connectors 102a while gaps 200 are formed between each magnet 100d and mating metal element 102c. FIG. 10 illustrates that the pads 100e are in sliding contact with the contact surfaces 102d on the device-under-test 102 once applied. FIG. 11 finally illustrates a top view of the probing apparatus 100 showing how the probing instruments 100b, 100f, magnets 100d and pads 100e are arranged in this example.

As mentioned above, each magnet's 100d position may be adjustable relative the mating metal element 102c for regulating the gap 200, so as to control the attracting force on the mating metal element 102c and thereby also the total resulting force holding the apparatus 100 onto the device-under-test 102.

In this example, the magnets 100d are of different sizes where one magnet 100d' is somewhat longer than the other two magnets 100d. This is a practical matter of design since the screw heads 102c in this case are of different heights comprising two longer screw heads and one shorter screw head, and so two shorter and one longer magnet, respectively, are used here to match these screw heights. It should be noted that each gap 200 is adjustable individually such that the attraction force can be carefully controlled. For example, if the magnets are too close to the screw heads, then the probing apparatus 100 will tend to hit the device-under-test 102 severely and this effect might damage the connectors 102a on the device. If the magnets are adjusted not so close to the screw heads, i.e. the gap 200 is somewhat wider, then the probing apparatus 100 can be applied and aligned more smoothly with help of the pads/sliding surfaces 100e, in case of any misalignment between the probing instruments 100b, 100f and the connectors 102a.

While the solution has been described with reference to specific exemplifying embodiments, the description is generally only intended to illustrate the inventive concept and should not be taken as limiting the scope of the solution. For example, the terms "probing apparatus", "device-under-test", "probing instrument", and "spring device" have been used throughout this disclosure, although any other corresponding entities, functions, and/or parameters could also be used having the features and characteristics described here. The solution is defined by the appended claims.

The invention claimed is:

1. A probing apparatus arranged for detection of an electric signal generated by a device-under-test by tapping the electric signal from a connector on the device-under-test when the probing apparatus is applied on the device-under-test, the probing apparatus comprising:
   a rigid support structure having a contact surface adapted for sliding contact with the device-under-test,
   a probing instrument fixed to the support structure and being adapted to contact the connector for tapping the electric signal, and
   at least two magnets fixed to the support structure, each magnet being adapted to apply attracting force on a mating metal element on the device-under-test such that the probing instrument is aligned to contact the connector, wherein a gap is formed between each magnet and mating metal element when said contact surface touches the device-under-test, wherein said mating metal element is a screw head.

2. The probing apparatus according to claim 1, wherein the probing apparatus further comprises at least one spring device adapted to be compressed against a spring force when the probing apparatus is applied on the device-under-test, so as to apply a repelling force which balances the attracting force applied by the at least two magnets such that the probing apparatus and the device-under-test are held together with controlled force.

3. The probing apparatus according to claim 2, wherein the at least one spring device comprises a telescopic cylinder surrounding the probing instrument and being adapted to contact the device-under-test and retract against the spring force when the probing apparatus is applied on the device-under-test.

4. The probing apparatus according to claim 3, wherein the telescopic cylinder is adapted to align the probing instrument to the connector by entering a tapered cavity on the device-under-test when the probing apparatus is applied on the device-under-test.

5. The probing apparatus according to claim 1, wherein the contact surface on the support structure is adapted to allow a sliding movement when touching a corresponding contact surface on the device-under-test.

6. The probing apparatus according to claim 5, wherein the contact surface on the support structure comprises one or more flat parts having portions that are parallel to the contact surface on the device-under-test when the probing apparatus is applied on the device-under-test, wherein the portions that are parallel to the contact surface on the device-under-test are in contact with the contact surface on the device-under-test.

7. The probing apparatus according to claim 5, wherein the contact surface on the support structure comprises a plurality of protruding knobs for contacting the contact surface on the device-under-test.

8. The probing apparatus according to claim 1, wherein the probing instrument is adapted to convey the tapped electric signal to a signal detector for analysis of the electric signal.

* * * * *